(12) United States Patent
Koolmees et al.

(10) Patent No.: US 11,022,901 B2
(45) Date of Patent: Jun. 1, 2021

(54) POSITIONING DEVICE, MAGNETIC SUPPORT SYSTEM AND LITHOGRAPHIC APPARATUS

(71) Applicant: ASML NETHERLANDS B.V., Veldhoven (NL)

(72) Inventors: Hessel Bart Koolmees, Eindhoven (NL); Johannes Petrus Martinus Bernardus Vermeulen, Leende (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/647,080

(22) PCT Filed: Sep. 24, 2018

(86) PCT No.: PCT/EP2018/075764
§ 371 (c)(1),
(2) Date: Mar. 13, 2020

(87) PCT Pub. No.: WO2019/072529
PCT Pub. Date: Apr. 18, 2019

(65) Prior Publication Data
US 2020/0278616 A1 Sep. 3, 2020

(30) Foreign Application Priority Data

Oct. 11, 2017 (EP) .................................... 17195886

(51) Int. Cl.
*G03F 7/20* (2006.01)
(52) U.S. Cl.
CPC ................ *G03F 7/70758* (2013.01)
(58) Field of Classification Search
CPC .... G03F 7/70758; H02K 41/03; H02K 55/00; H01F 6/04; F17C 13/087
See application file for complete search history.

(56) References Cited

U.S. PATENT DOCUMENTS

| 2001/0013925 A1* | 8/2001 | Loopstra ............. G03F 7/70725 |
| | | 355/30 |
| 2009/0058199 A1* | 3/2009 | Ito ........................ H02K 41/031 |
| | | 310/12.06 |

(Continued)

FOREIGN PATENT DOCUMENTS

| GB | 2012495 | 7/1979 |
| GB | 2025029 | 1/1980 |

(Continued)

OTHER PUBLICATIONS

European Search Report issued in corresponding European Patent Application No. 17195886, dated Mar. 21, 2018.

(Continued)

*Primary Examiner* — Steven Whitesell Gordon
(74) *Attorney, Agent, or Firm* — Pillsbury Winthrop Shaw Pittman LLP

(57) ABSTRACT

A positioning device configured to position an object, the positioning device including: an object table configured to hold the object; an electromagnetic motor configured to displace the object table, the electromagnetic motor including: a coil assembly mounted to the object table, a superconductor assembly configured to co-operate with the coil assembly to generate a driving force on the object table, and a cryogenic enclosure configured to enclose the superconductor assembly and maintain the superconductor assembly in a superconductive state; a support for supporting the electromagnetic motor; and an electromagnetic support configured to suspend the cryogenic enclosure relative to the support, thereby maintaining a gap between the cryogenic enclosure and the support.

20 Claims, 8 Drawing Sheets

(56) References Cited

U.S. PATENT DOCUMENTS

2014/0327327 A1 11/2014 Kou et al.
2015/0146176 A1 5/2015 Pharand et al.

FOREIGN PATENT DOCUMENTS

JP S6117798 1/1986
WO 2006034521 4/2006

OTHER PUBLICATIONS

International Search Report issued in corresponding PCT Patent Application No. PCT/EP2018/075764, dated Jan. 8, 2019.

* cited by examiner

POSITIONING DEVICE, MAGNETIC SUPPORT SYSTEM AND LITHOGRAPHIC APPARATUS

CROSS-REFERENCE TO RELATED APPLICATIONS

This application is the U.S. national phase entry of PCT Patent Application No. PCT/EP2018/075764, which was filed Sep. 24, 2018, which claims the benefit of priority of European Patent Application No. 17195886.1, which was filed on Oct. 11, 2017 and which is incorporated herein in its entirety by reference.

BACKGROUND

Field of the Invention

The present invention relates to a positioning device, a magnetic support system, and a lithographic apparatus.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Typically, the lithographic apparatus comprises a plurality of positioning devices for accurately positioning the patterning device and the substrate. Such positioning devices can e.g. comprise one or more electromagnetic motors such as linear motors or planar motors. Such linear or planar motors typically comprise a coil assembly co-operating with a magnet assembly for generating a driving force on an object table to which the patterning device or the substrate is mounted.

It would be desirable to improve the performance of such motors. Such improvements could e.g. be an increase of the force per unit moving mass of the motor or a reduction of the losses in the coil assembly.

SUMMARY

It is desirable to provide an improved positioning device for use in a lithographic apparatus. According to an embodiment of the invention, there is provided a positioning device configured to position an object, the positioning device comprising:

an object table configured to hold the object;
an electromagnetic motor configured to displace the object table, the electromagnetic motor comprising:
  a coil assembly;
  a superconductor assembly configured to co-operate with the coil assembly to generate a driving force on the object table;
  a cryogenic enclosure configured to enclose the superconductor assembly and maintain the superconductor assembly in a superconductive state;
  a support for supporting the cryogenic enclosure;
  an electromagnetic support configured to suspend the cryogenic enclosure relative to the support, thereby maintaining a gap between the cryogenic enclosure and the support.

According to another aspect of the present invention, there is provided a magnetic support system for supporting a cryogenic enclosure, the magnetic support system comprising:

a support;
an electromagnetic support configured to suspend the cryogenic enclosure relative to the support, thereby maintaining a gap between the cryogenic enclosure and the support.

According to yet another aspect of the present invention, there is provided a lithographic apparatus comprising:

an illumination system configured to condition a radiation beam;
a patterning device support constructed to support a patterning device, the patterning device being capable of imparting the radiation beam with a pattern in its cross-section to form a patterned radiation beam;
a substrate table constructed to hold a substrate; and
a projection system configured to project the patterned radiation beam onto a target portion of the substrate,
wherein the apparatus further comprises a positioning device according to the present invention,
the positioning device being configured to position the patterning device support or the substrate table or both.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
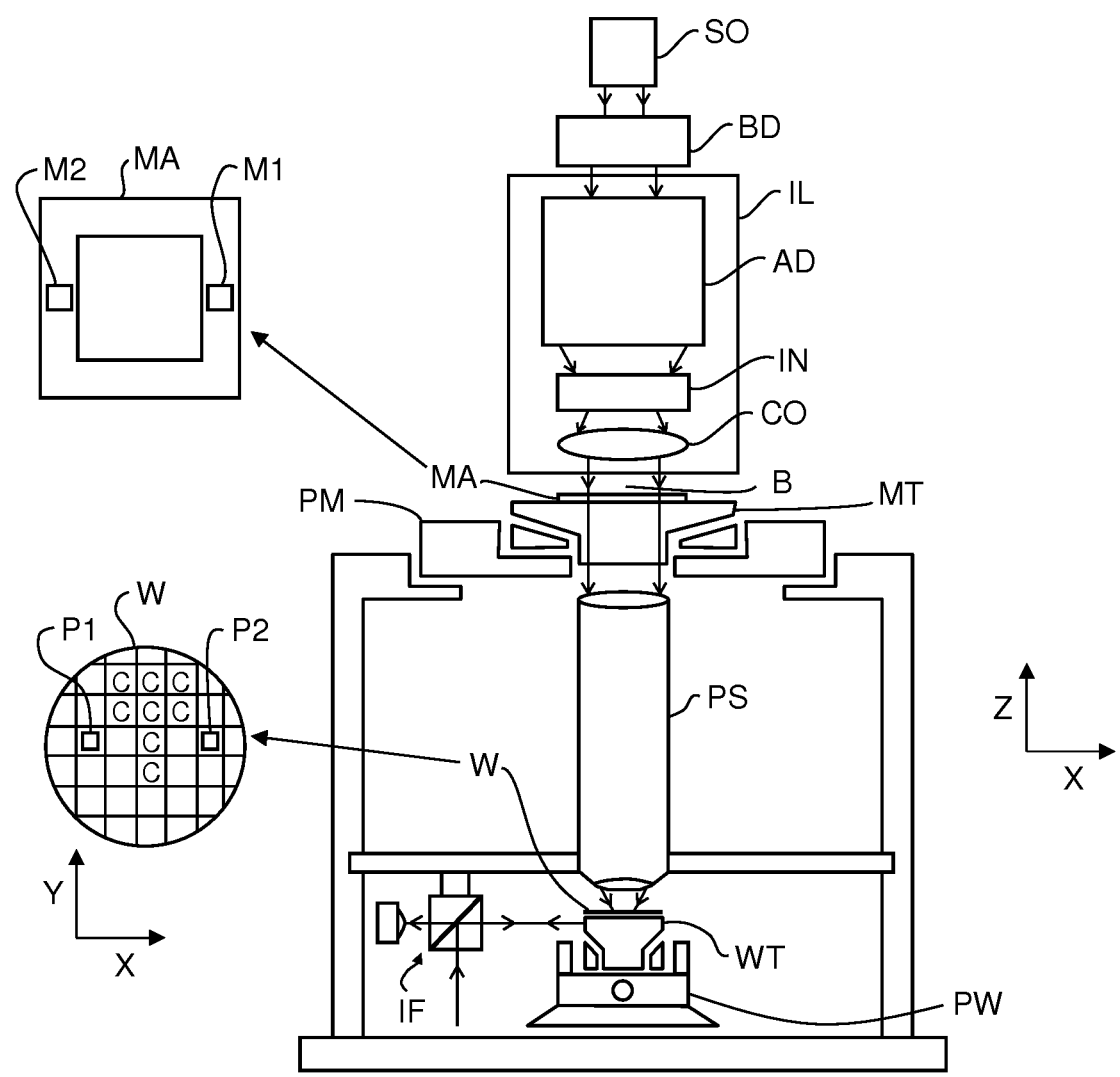
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

In an embodiment, either the first positioning device PM, or the second positioning device PW, or both, of the lithographic apparatus may comprising a positioning device according to the present invention, either to displace the mask support structure, or the substrate support, or both.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system.

Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In the apparatus as shown, both the substrate table WT and the mask table MT can thus be moved relative to the beam B by means of positioning devices such as the first positioning device PM or the second positioning device PW. In accordance with an aspect of the present invention, a positioning device is provided that can be applied in either the first positioning device PM or the second positioning device PW or in both.

Figure 2:
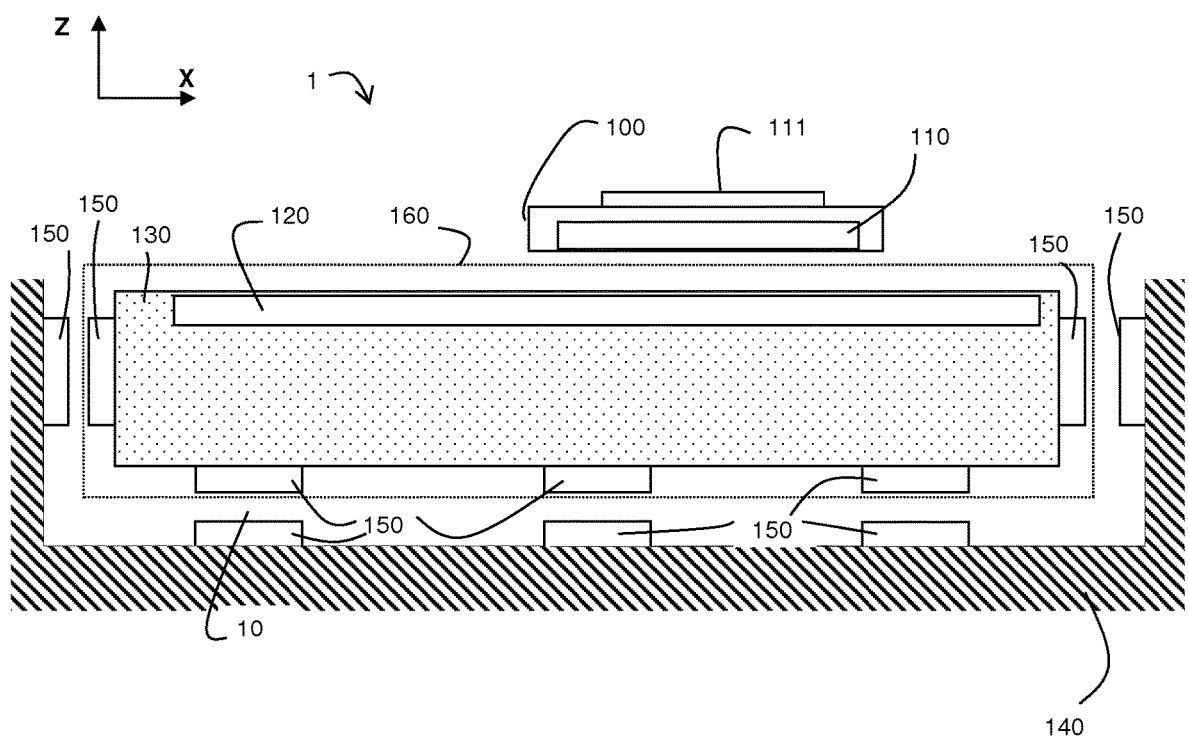
FIG. 2 depicts a cross-sectional view of a positioning device according to an embodiment of the present invention.

FIG. 2 shows an embodiment of a positioning device 1 according to the invention, the positioning device 1 comprises an object table 100. The object table 100 is configured to hold an object 111. The positioning device 1 is configured to position the object table 100, thereby positioning the object 111. The positioning device 1 as shown may e.g. be applied in a lithographic apparatus according to the present invention for positioning the substrate table WT, said substrate table WT holding a substrate W.

The positioning device 1 comprises an electromagnetic motor, which is configured to exert a driving force on the object table 100, in order to position the object 111 that is mounted to the object table 100. The electromagnetic motor comprises a coil assembly 110 and a superconductor assembly 120. In the embodiment as shown, the coil assembly 110 is mounted to the object table 100, whereas the superconductor assembly 120 is enclosed by a cryogenic enclosure 130. In an embodiment, the object table further comprises an object holder configured to hold the object and a plurality of actuators for fine or accurate positioning of the object holder. Such plurality of actuators may e.g. be referred to as a short stroke positioning device. In such embodiment, the object holder may e.g. comprise a clamp, such as a vacuum clamp or electrostatic clamp, for holding the object. In an embodiment, the plurality of actuators or short stroke positioning device may comprise a plurality of electromagnetic actuators or piezoelectric actuators.

The superconductor assembly 120 is configured to generate a spatially alternating magnetic field. In the embodiment of FIG. 2, the magnetic field as generated by the superconductor assembly 120 may e.g. be a two-dimensional spatially alternating field, e.g. a spatially alternating magnetic field in both the X-direction and the Y-direction; the Y-direction being perpendicular to the plane of the drawing.

During use, the coil assembly 110 is connected by current leads to a controllable current source. During use, the spatially alternating magnetic field as generated by the superconductor 120 may interact with a current supplied to the coil assembly 110 to generate a driving force on the object table 100. For example, by controlling the controllable current source and thus the current through the coil assembly 110, the driving force can be controlled, and thereby the movement of the coil assembly 110 and the object table 100, relative to the superconductor assembly 120. In an embodiment, the coil assembly 110 may e.g. comprise a plurality of coils. In an embodiment, the coil assembly may e.g. comprise a first set of coils extending in the X-direction and a second set of coils extending in the Y-direction.

In order to generate the spatially alternating magnetic field, the superconductor assembly 120 may comprises a plurality of superconductor coils. Said superconductor coils may e.g. be supplied from a low voltage, high current supply source, which can e.g. be mounted to the support or support frame 140.

The positioning device 1 further comprises a cryogenic enclosure 130 which is configured to enclose the superconductor assembly 120. The cryogenic enclosure 130 is adapted to maintain the temperature of the superconductor assembly 120 below a critical temperature. The critical temperature is the temperature below which the superconductor assembly 120 is in a superconductive state, and is dependent on the material used for the superconductor assembly 120. The critical temperature may be as low as in a range of 4K-30K. The cryogenic enclosure 130 may for example comprise a suitable cooling fluid, wherein the cryogenic enclosure 130 is connected to a compressor (not shown) for supplying the cooling fluid at low temperature. To maintain the cryogenic enclosure 130 below the critical temperature, there are preferably as little physical contacts between the cryogenic enclosure 130 and its environment or surrounding, since such contacts entail conduction of heat into the cryogenic enclosure 130. However, the cryogenic enclosure 130 must be supported in a support or support frame 140. Such a support or support frame 140 will have to accommodate the motor forces from the superconductor assembly 120.

In order to mitigate the heat flux towards the cryogenic enclosure 130, the present invention provides in the use of an electromagnetic support 150 that is configured to suspend the cryogenic enclosure 130 relative to a support 140, thereby maintaining a gap 10 between the cryogenic enclosure 130 and the support 140. As such, a support of the cryogenic enclosure 130 and the superconductor assembly 120 is achieved by means of an electromagnetic support, i.e. a support that does not require making physical contact between the support 140 and the cryogenic enclosure 130. Such an arrangement may be highly advantageous compared to supports that entail physical contact. Examples of such physical supports include the use of struts such as used to support or suspend a cryogenic enclosure of an MRI cryogenic enclosure. However, such physical contacts result in a conductive heat transfer from the support 140 into the cryogenic enclosure 130. It has been devised by the inventors that the heat flux towards the cryogenic enclosure 130 when using the electromagnetic support 150 according to the invention is several orders of magnitude smaller than alternative solutions. For example, compared to an arrangement whereby the cryogenic enclosure 130 would be suspended or supported using a set of six struts or folded leaf springs, e.g. each for one degree of freedom, the heat flux towards the cryogenic enclosure can be reduced by a several orders of magnitude.

The electromagnetic support 150 as used in the positioning device according to the present invention may comprises any kind of suitable magnetic components, such as permanent magnets, electromagnets, reluctance actuators, Lorentz actuators, or any combinations of such components.

The cryogenic enclosure 130 is in the shown example further surrounded by an optional heat shield 160 which functions as an insulation to minimize the transfer of heat from the support frame 140, which is on a high temperature, e.g. room temperature, to the cryogenic enclosure 130, which is on a low temperature, e.g. in a range between 4-30 K.

In an embodiment, the heat shield may be an active heat shield, which is e.g. maintained at an intermediate temperature between room temperature and the cryogenic enclosure temperature. Alternatively, or in addition, the heat shield as applied in an embodiment of the present invention may comprise a passive heat shield, e.g. comprising a multilayer insulation (MLI).

The active or actively cooled heat shield can e.g. be used to remove heat at a higher temperature than the cryogenic temperature of the cryogenic enclosure, while the MLI increases the radiative thermal resistance. As an example, the cold temperature of the cryogenic enclosure 130 may e.g. be in the range of 4-30 K, the support 140 may e.g. be at room temperature and the active heat shield may e.g. be maintained at a temperature in the range of 50 to 150 K, e.g. 80 K.

In accordance with an embodiment of the present invention, the combination of the cryogenic enclosure, the support and the electromagnetic support supporting the cryogenic enclosure can be considered to function as a cryostat, in which the cryogenic enclosure, enclosing the superconductor assembly, is contactless supported or suspended.

In a preferred embodiment, the heat shield 160 encloses the cryogenic enclosure 130 entirely, thereby minimizing the heat transfer. It should be pointed out that this may not be required. In particular, in an embodiment, the heat shield may comprise a plurality of different portions or may comprise a combination of active portions and passive portions, the latter e.g. comprising MLI. It may also be pointed out that, inside the gap formed between the two co-operating members of the electromagnetic support or supports, a compromise may need to be made between providing a heat shield and obtaining an efficient electromagnetic or magnetic support. For efficiency purposes, it may be desirable to e.g. keep the gap between the co-operating members of the electromagnetic or magnetic support (e.g. members 310 and 320, or members 220 and 210) as small as possible. This however limits the available space for the heat shield.

In an embodiment, the superconductor assembly 120 comprises one or more current leads (not shown) for supplying a current from a current or voltage supply, e.g. mounted to the support, to the superconductor assembly 120. These current leads may thus also conduct heat towards the cryogenic enclosure 130 and may also generate heat themselves due to their electrical resistance. To minimize this effect, the current lead or leads can optionally be made in two parts, wherein a first part is a copper part which extends between the current or voltage supply and the heat shield 160, which is e.g. held at an intermediate temperature, and the second part, e.g. a superconductive part which extends from the heat shield 160 to the cryogenic enclosure 130. In such an embodiment, the heat leak of the copper part can be removed at the intermediate temperature using the heat shield 160. Because the heat shield is at a higher temperature, compared to the cryogenic enclosure, such heat removal can be done at a higher efficiency, as can e.g. be derived from Carnot's theorem.

When the driving force on the object table 100 is generated by the electromagnetic motor 110, 120, an equal and opposite reaction force is generated and exerted on the superconductor assembly 120. In an embodiment, the superconductor assembly 120, together with the enclosing cryogenic enclosure 130 may function as a balance mass and may thus move in a direction opposite to the moving direction of the object table 100 due to the driving force. As will be appreciated by the skilled person, using a balance mass construction in a positioning device such as positioning device 1, enables to mitigate that the reaction force to the driving force are exerted on the environment, thus reducing the generation of vibrations in other components, e.g. supports of the positioning device. Within a lithographic apparatus, a balance mass construction can e.g. be applied in a positioning device such as positioning device PM or positioning device PW. In particular in a lithographic apparatus, the transmission of vibrations to components such as measurement systems or the projection system PS should be avoided or mitigated, in order to accurately project a patterned beam of radiation B onto a substrate W. It is desirable that the movement of the balance mass is comparatively small. The heavier the balance mass is, the smaller the movement due to the reaction force created by the movement of the object table 100 is. Therefore, it is advantageous to arrange the cryogenic enclosure 130 such that it moves together with the superconductor assembly 120, thereby making the cryogenic enclosure 130 part of the balance mass. The movement of superconductor assembly 120 in the shown example may be considerably smaller than the movement of the object table 100, since the balance mass, comprising the superconductor assembly 120 and the cryogenic enclosure 130, may be considerably heavier than the object table 100 and the coil assembly 110 mounted to the object table 100.

In order to avoid or mitigate the transmission of vibrations or forces towards the environment, the balance mass should be able to move relatively freely in the XY-plane. In the Z-direction however, the balance mass should preferably move as little as possible. Thus, in the XY-plane the stiffness to which the movement of the balance mass is subjected is preferably small, while in the Z-direction the stiffness is preferably large. In alternative solutions for supporting the cryogenic enclosure 130 which would entail physical contacts, a compromise must be made, since a stiff support is needed for stable positioning but the thermal conductivity by the supports should be minimized. The stiffness and thermal conductivity are coupled and physically linked by the material properties of such supports. In the present invention, this is solved by providing a contact-free support using the electromagnetic support 150. As such, the stiffness and the thermal conductivity are decoupled, and the stiffness can be arranged as desired without having a negative effect on the thermal conductivity.

In a possible embodiment, the positioning device 1 comprises one or more electromagnetic actuators for controlling a position of the cryogenic enclosure relative to the support frame 140. Such an electromagnetic actuator may for example be a reluctance actuator 300 as is shown in FIG. 3.

Figure 3:
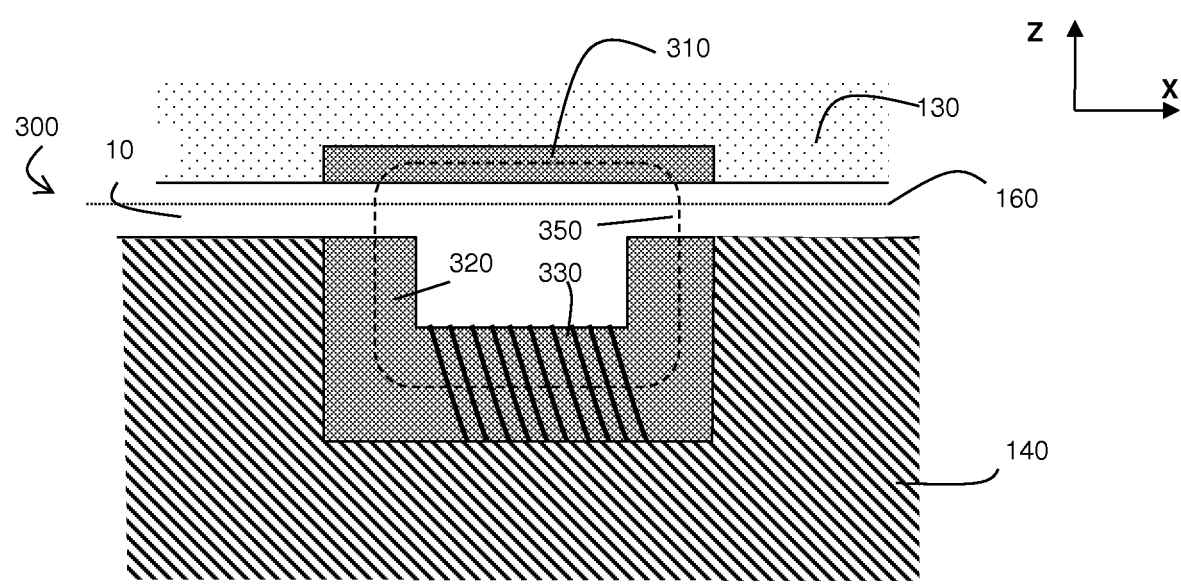
FIG. 3 schematically depict cross-sectional view of an electromagnetic actuator as can be applied in a positioning device according to the present invention.

In FIG. 3 a reluctance actuator 300 is shown, which comprises a first ferromagnetic part 310 that is mounted to the cryogenic enclosure 130, and a second ferromagnetic part 320 that is mounted to the support 140 and around which an electrical wire 330 is wound to from a coil. When an electrical current is conducted by the electrical wire 330, a magnetic flux 350 is generated which subjects the first ferromagnetic part 310 and thus the cryogenic enclosure 130 to a downwards force and corresponding movement. In order to control the vertical position of the cryogenic enclosure 130, the electromagnetic support 150 as applied in the present invention may be configured to generate an upward preload force for compensating the weight of the cryogenic enclosure 130 and superconductor assembly 120. Examples of magnetic or electromagnetic supports that may generate such a preload force are discussed in more detail below. When such a preload force is provided, the vertical position, in the Z-direction, of the cryogenic enclosure 130 can be controlled with the reluctance actuator 300. The construction as shown in the example of FIG. 3 only provides unidirectional control. In order to provide bidirectional control, it is possible to provide a preload force or to provide an actuator that provides bidirectional control, i.e. both in the upward and in the downward direction. It should further be noted that it is possible to make the first ferromagnetic part 310 larger than the second ferromagnetic part 320 in the X- and/or Y-direction to enable working of the reluctance actuator over a longer stroke in those directions.

Figure 4:
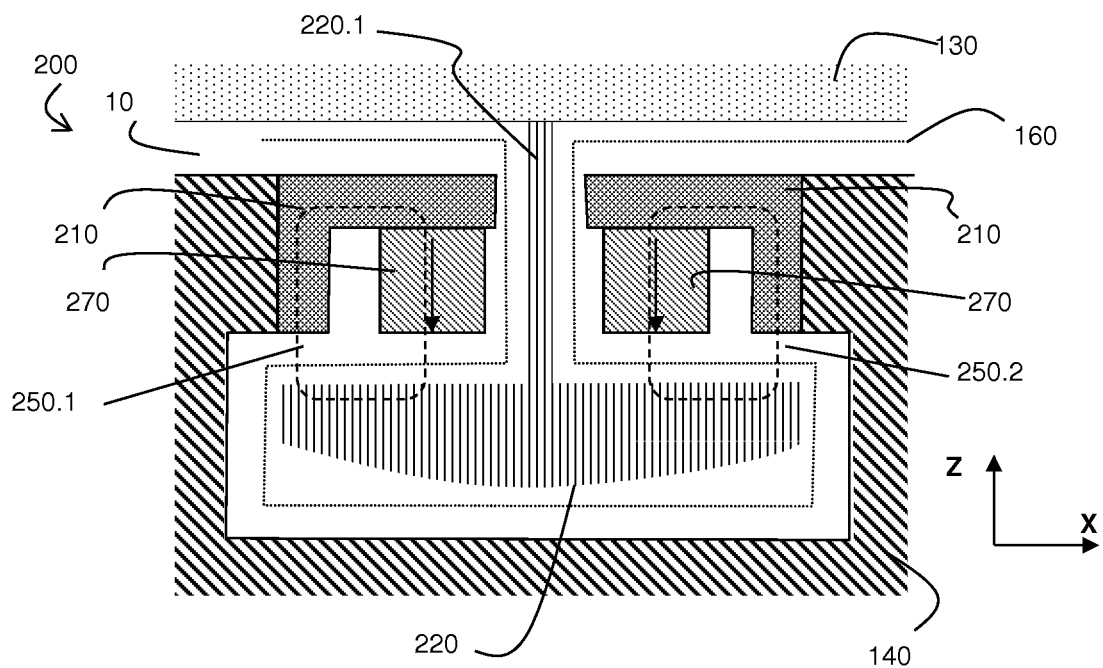
FIG. 4a schematically depicts a cross-sectional view of a passive magnetic support as can be applied in a positioning device according to the present invention.
FIG. 4b schematically depicts a cross-sectional view of a passive magnetic support with an integrated reluctance actuator as can be applied in a positioning device according to the present invention.
Figure 4:
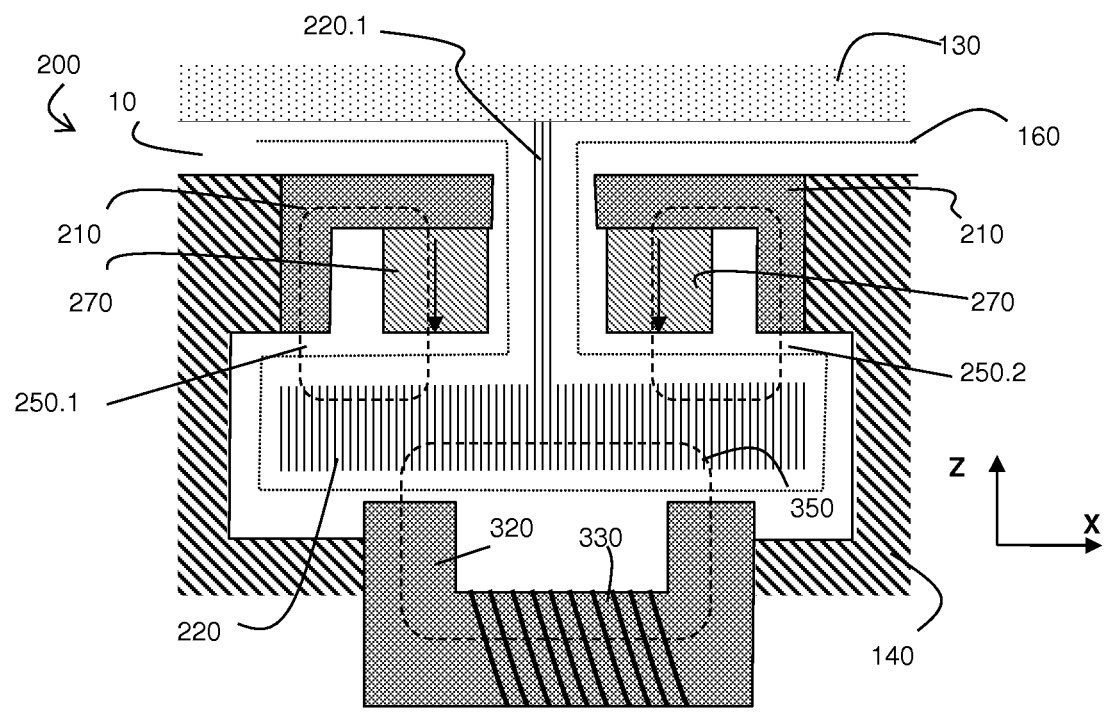

In an embodiment, the positioning device 1 comprises a passive magnetic support 200 configured to exert a force, for example an upwards force, on the cryogenic enclosure 130, so as to generate the gap 10. A possible embodiment of such a passive magnetic support 200 is shown in FIG. 4.

In FIG. 4a, the passive magnetic support 200 is shown as being placed on what in FIG. 2 would be the bottom of the support 140. The passive magnetic support 200 comprises a ferromagnetic member 220 that is connected to the cryogenic enclosure 130 by a downwards extending rod or plate 220.1. The passive magnetic support 200 further comprises one or more permanent magnets 270 mounted to a ferromagnetic yoke 210.

In the shown example, the optional heat shield 160 is located between the 'cold' components, comprising cryogenic enclosure 130, the ferromagnetic member 220 and the downwards extending rod 220.1, on the one hand, and the 'warm 'components, comprising the permanent magnet or magnets 270, the ferromagnetic yoke 210 and the support 140 on the other hand. For example, the cold components may be on 4K, while the warm components are on 300K.

The permanent magnet or magnets 270 cause a magnetic field in in the passive magnetic support, which is represented in FIG. 4a as magnetic fluxes 250.1 and 250.2 respectively. The magnetic fluxes 250.1 and 250.2 cause an upwards force on the cold ferromagnetic member 220, which consequently is forced to move upwards, thereby generating and the gap 10 between the cryogenic enclosure 130 and the support 140. In order to maintain a size of the gap 10 at a predetermined value, an active control of the resulting vertical force on the cryogenic enclosure 130 may be required. Such an active control of the resulting vertical force may e.g. be realized by combining the passive magnetic support 200 with one or more actuators, such as the reluctance actuator shown in FIG. 3. In an embodiment, a passive magnetic support, such as the passive magnetic support 200 and a reluctance actuator, such as reluctance actuator 300, can be integrated. Such an arrangement is schematically shown in FIG. 4b. In the embodiment as shown, the ferromagnetic member 220 forms a reluctance actuator with the ferromagnetic part 320 that is mounted to the support 140 and around which an electrical wire 330 is wound to from a coil. When an electrical current is conducted by the electrical wire 330, a magnetic flux 350 is generated which subjects the ferromagnetic part 220 and thus the cryogenic enclosure 130 to a downwards force and corresponding movement.

It should be noted that the construction of the passive magnetic support 200 as shown in FIG. 4 can be used to provide a preload force on the cryogenic enclosure 130, such that the reluctance actuator 300 as shown in FIG. 3 can be used to provide bidirectional control in the Z-direction.

Figure 5:
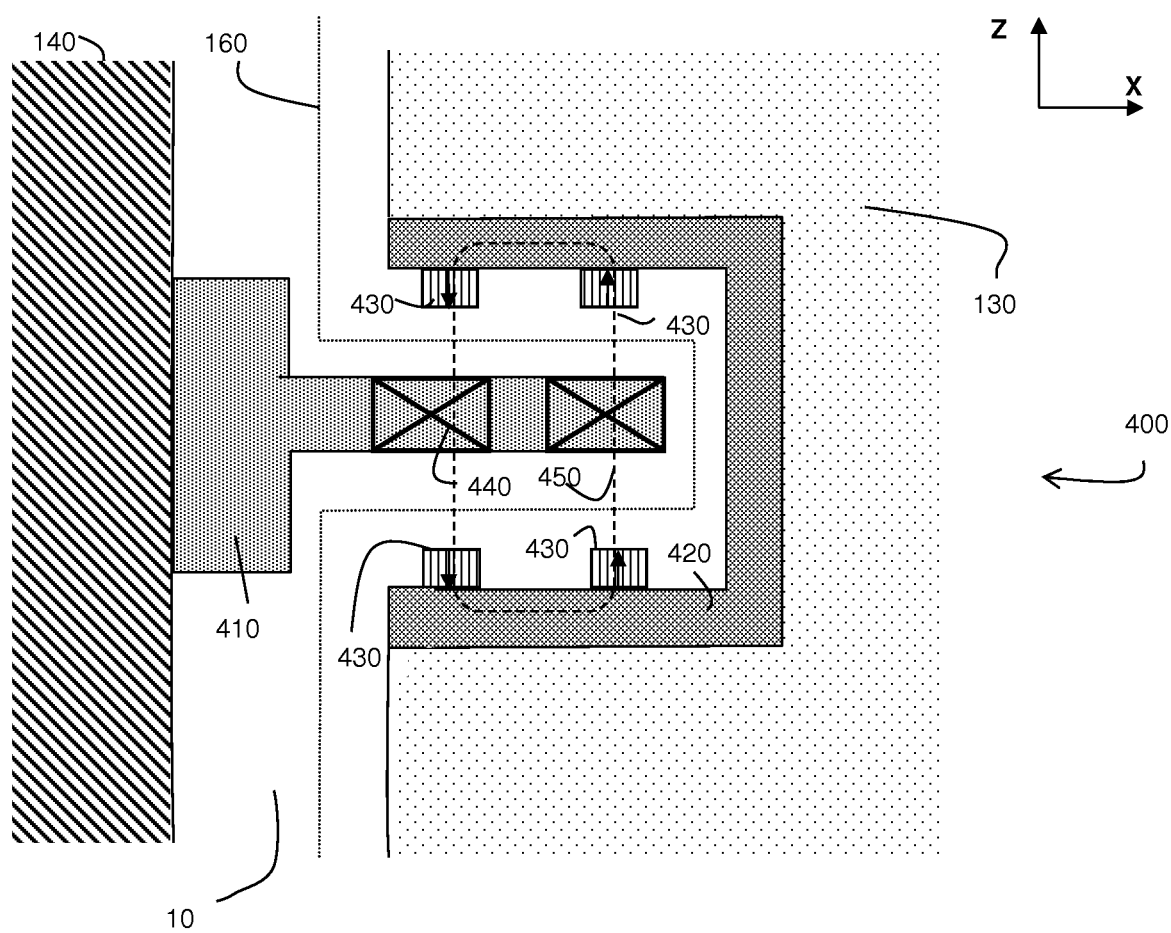
FIG. 5 schematically depicts a cross-sectional view of an electromagnetic actuator as can be applied in a positioning device according to the present invention.

Another type of electromagnetic actuator that can be used to control the position of the cryogenic enclosure 130 relative to the support 140 is a Lorentz actuator 400 as shown in FIG. 5. In the example shown in FIG. 5, the Lorentz actuator 400 is located on what in FIG. 2 would be the left side of the cryogenic enclosure 130. In this construction, the Lorentz actuator 400 is used to control the position of the cryogenic enclosure 130 in the horizontal X-direction.

The Lorentz actuator 400 comprises a first part 410 which is mounted to the support 140, and has a part extending in the X-direction, towards the cryogenic enclosure 130, in which part a coil 440 is provided. A second ferromagnetic part 420 is mounted to the cryogenic enclosure 130, whereby a plurality of permanent magnet 430 are mounted to the second ferromagnetic part 420 to generate a magnetic flux 450. The two permanent magnets 430 that are in FIG. 5 shown above the first ferromagnetic part 410 are oriented in opposite direction with respect to each other. Depending on the direction of the electrical current through the coil 440 and the interaction of the current with the magnetic flux 450 of the permanent magnets 430, the second ferromagnetic part 420 is subjected to a driving force in the X-direction, thereby causing the cryogenic enclosure 130 to move relative to the support 140. As such, the position of the cryogenic enclosure 130 in the X-direction can be controlled.

Figure 6:
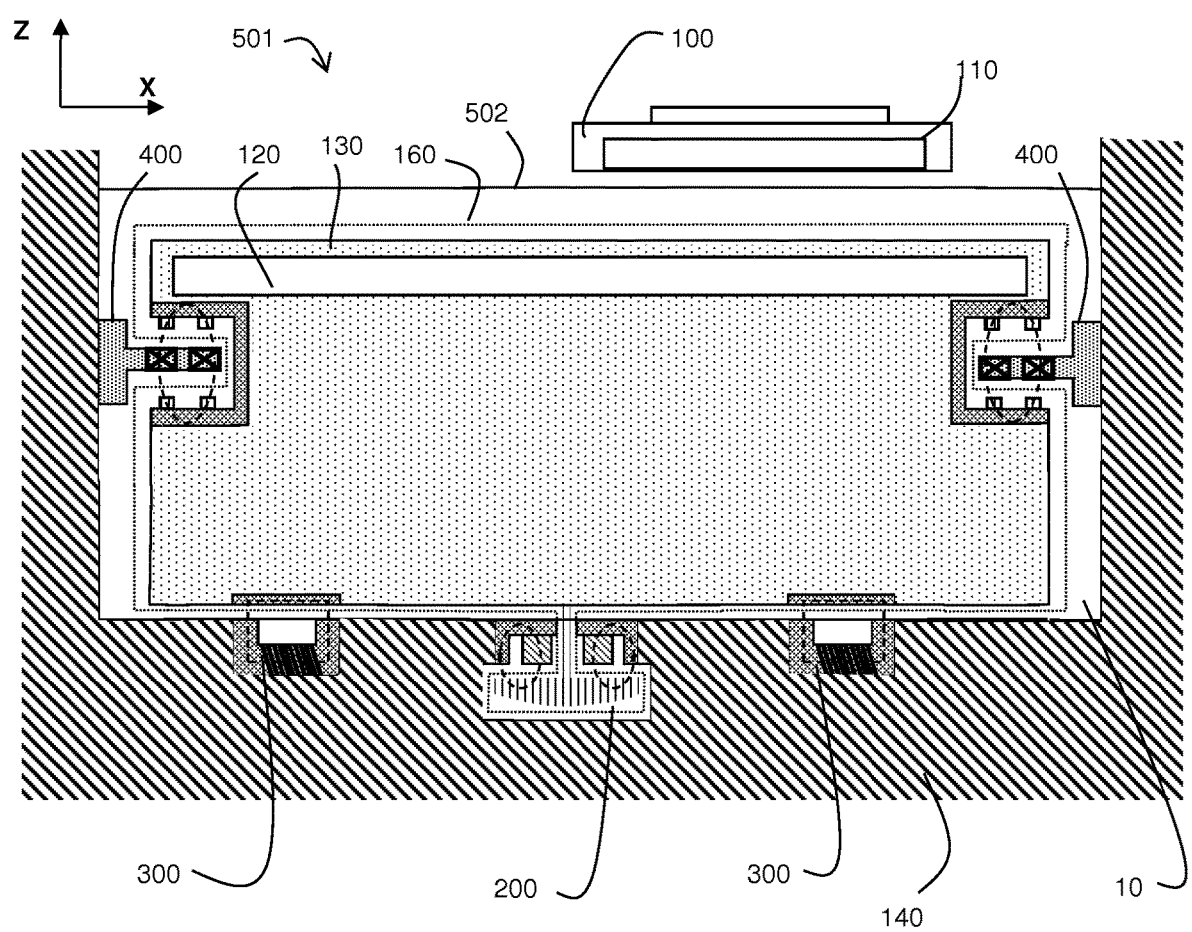
FIG. 6 depicts a cross-sectional view of a positioning device according to a further embodiment of the present invention.

FIG. 6 depicts a cross-sectional view of a positioning device 501 according to the invention, which comprises at the bottom two reluctance actuators 300 as shown in FIG. 3 and a passive magnetic support 200 as shown in FIG. 4. The passive magnetic support 200 generates a preload force which is directed upwards in the Z-direction, and thus causes the cryogenic enclosure 130 to move upwards. The reluctance actuators 300 are configured to generate an attractive force on the cryogenic enclosure 130 which causes a downwards movement in the Z-direction, which in combination with the preload force of the passive magnetic support 200 enables to control the vertical position of the cryogenic enclosure 130 in the Z-direction relative to the support 140.

The positioning device 501 further comprises a Lorentz actuator 400 on the left side of FIG. 6, and another Lorentz actuator 400 on the right side of FIG. 6. Each Lorentz actuator 400 enables movement in the X-direction, and consequently control of the position of the cryogenic enclosure 130 relative to the support 140. Furthermore, the Lorentz actuators 400 enable to control the stiffness of the suspension of the cryogenic enclosure 130 and the movement of both the cryogenic enclosure 130 and the superconductor assembly 120, serving as balance mass. These actuators may thus also serve to prevent a drifting of the balance mass.

In the embodiment as shown, the cryogenic enclosure 130 is arranged in a vacuum or low pressure environment, the vacuum or low pressure environment being formed by a wall or walls of the support 140 and a plate shaped enclosure 502, arranged between the cryogenic enclosure and the object table 100. By doing so, the heat transfer to the cryogenic enclosure 130 can be mitigated further. In the arrangement as shown, the object table 100 may be arranged in an atmospheric environment or may also be arranged in a vacuum or low pressure environment.

In case the cryogenic enclosure 130 is arranged in a vacuum or low pressure environment, the heat transfer via (residual) gas conduction can be kept comparatively small. This can e.g. be realized by applying a comparatively low pressure in the vacuum or low pressure environment, e.g. $<10^{-3}$ Pa. A further source of heat transfer towards the cryogenic enclosure 130 would be a heat transfer by means of radiation. In order to mitigate the effect of such a radiation heat transfer, a heat shield 160 as discussed above can be used.

Optionally, the positioning system 501 further comprises one or more position sensors (not shown), such that the position of the cryogenic enclosure 130 is known. This information may be used in a control loop to control the position of the cryogenic enclosure 130.

Although not visible in the cross-sectional view as shown in FIG. 6, it will be appreciated by the skilled person that there may also be Lorentz actuators provided on the sides that would be in FIG. 6 the front and the back of the cryogenic enclosure 130 and support frame 140, which Lorentz actuators enable movement and control in the Y-direction, the Y-direction being perpendicular to the XZ-plane.

It will further be appreciated by the skilled person that, notwithstanding the example shown in FIG. 6, the invention can be practiced using active and/or passive electromagnetic components other than those shown in FIG. 6, as well as that the components may be implemented in other proportions or on other locations. All of such embodiments form part of the invention. For example, Lorentz actuators may be used for control in the Z-direction, and reluctance actuators for control in the X- and/or Y-direction, or a combination of different types of actuators may be used for control in any given plane.

Figure 7:
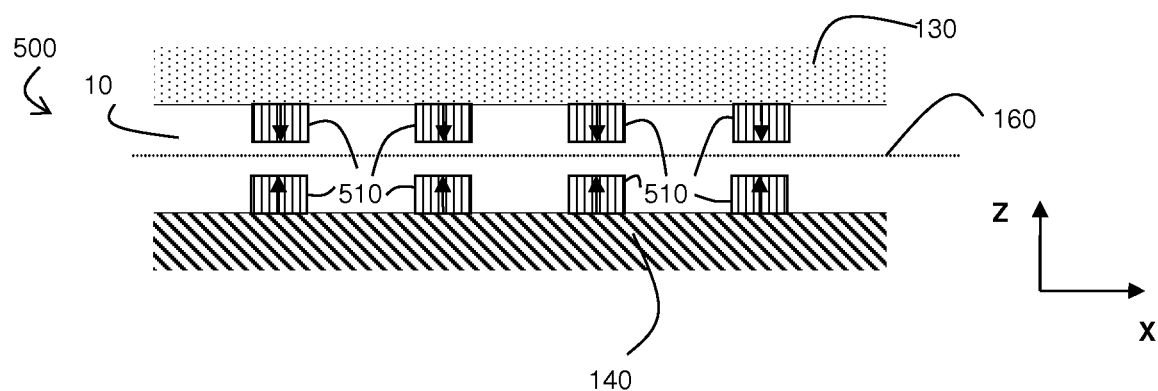
FIG. 7 schematically depicts a cross-sectional view of a passive magnetic support as can be applied in a positioning device according to the present invention.

FIG. 7 shows a cross-sectional view of another embodiment of a passive magnetic support 500. In this embodiment, there are four permanent magnets 510 are mounted to the cryogenic enclosure 130, and opposite of those, four permanent magnets 510 are mounted to the support 140. The permanent magnets 510 are configured such that a repelling force is created to generate and maintain the gap 10 between the support 140 and the cryogenic enclosure 130. As will be understood by the skilled person, the repelling force will become weaker when the permanent magnets 510 that are mounted to the cryogenic enclosure 130 are located further away from the permanent magnets 510 mounted to the support, thus resulting in a stable equilibrium in the Z-direction of the cryogenic enclosure 130. Such an arrangement however provides an unstable equilibrium in the X and Y directions perpendicular to the Z-direction. As such, it may be necessary to provide stabilizing components in the X- and Y-direction to prevent drifting of the cryogenic enclosure 130 in those directions. For this, other passive or active electromagnetic components, e.g. Lorentz actuators or reluctance actuators, may be used. Furthermore, in addition to the passive magnetic support 500, one or more electromagnetic actuators such as a reluctance actuator or Lorentz actuator may be used to control the position of the cryogenic enclosure 130 relative to the support 140 in the Z-direction.

The embodiments may further be described using the following clauses:

1. A positioning device configured to position an object, the positioning device comprising:
   an object table configured to hold the object;
   an electromagnetic motor configured to displace the object table, the electromagnetic motor comprising:
   a coil assembly;
   a superconductor assembly configured to co-operate with the coil assembly to generate a driving force on the object table;
   i. a cryogenic enclosure configured to enclose the superconductor assembly and maintain the superconductor assembly in a superconductive state;
   a support for supporting the cryogenic enclosure;
   an electromagnetic support configured to suspend the cryogenic enclosure relative to the support, thereby maintaining a gap between the cryogenic enclosure and the support.
2. The positioning device according to clause 1, wherein the electromagnetic support comprises one or more electromagnetic actuators for controlling a position of the cryogenic enclosure relative to the support.
3. The positioning device according to clause 1 or 2, wherein the electromagnetic support is configured to maintain the gap between a bottom surface of the support and a bottom surface of the cryogenic enclosure.
4. The positioning device according to clause 3, wherein the electromagnetic support comprises a passive magnetic support configured to exert, in use, an upward force on the cryogenic enclosure, so as to generate the gap.
5. The positioning device according to any of the preceding clauses, wherein the electromagnetic support is configured to maintain the gap with a stiffness.
6. The positioning device according to clause 4 or 5, wherein the electromagnetic support comprises one or more electromagnetic actuators configured to exert, in use, a downward force on the cryogenic enclosure, the upward force and downward force being configured to support the cryogenic enclosure with a stiffness.
7. The positioning device according to clause 2, wherein the one or more electromagnetic actuators are configured to control a horizontal position of the cryogenic enclosure.
8. The positioning device according to any of the preceding clauses, further comprising a heat shield arranged inside the gap.
9. The positioning device according to any of the preceding clauses, wherein the superconductor assembly is configured to generate a spatially alternating magnetic field.
10. The positioning device according to clause 9, wherein the spatially alternating magnetic field is a one-dimensional spatially alternating magnetic field or a two-dimensional spatially alternating magnetic field.
11. The positioning device according to any of the preceding clauses, wherein the cryogenic enclosure and the magnet assembly are configured to displace relative to the support frame, in response to a reaction force of the driving force.
12. The positioning device according to any of the preceding clauses, wherein the coil assembly is mounted to the object table and wherein the object table further comprises an object holder configured to hold the object and a plurality of actuators for fine positioning the object holder.
13. The positioning device according to clause 12, wherein the object holder comprises a clamp for holding the object.
14. The positioning device according to clause 13, wherein the clamp comprises a vacuum clamp or electrostatic clamp for holding the object.
15. The positioning device according to any of the clauses 12 to 14, wherein the plurality of actuators comprises a plurality of electromagnetic actuators or piezoelectric actuators.
16. A magnetic support system for supporting a cryogenic enclosure, the magnetic support system comprising:
a support;
an electromagnetic support configured to suspend the cryogenic enclosure relative to the support, thereby maintaining a gap between the cryogenic enclosure and the support.
17. The magnetic support system according to clause 16, wherein the electromagnetic support is a contactless support.
18. The magnetic support system for supporting a cryogenic enclosure according to clause 17, wherein the electromagnetic support comprises a passive magnetic support comprising a first member mounted to the support and a second member to be mounted to the cryogenic enclosure, the first and second member being configured to exert, in use, an upward force on the cryogenic enclosure, so as to generate the gap.
19. The magnetic support system according to any of the clauses 16 to 18, wherein the electromagnetic support comprises a plurality of electromagnetic actuators, configured to control a position of the cryogenic enclosure relative to the support; each of the plurality of electromagnetic actuators comprising a first actuator member configured to be mounted to the support and a second actuator member configured to be mounted to the cryogenic enclosure.
20. The magnetic support system according to any of the clauses 16 to 19, further comprising a heat shield configured to be arranged inside the gap.
21. A lithographic apparatus comprising:
an illumination system configured to condition a radiation beam;
a patterning device support constructed to support a patterning device, the patterning device being capable of imparting the radiation beam with a pattern in its cross-section to form a patterned radiation beam;
a substrate table constructed to hold a substrate; and
a projection system configured to project the patterned radiation beam onto a target portion of the substrate,
wherein the apparatus further comprises a positioning device according to any of the clauses 1 to 15, the positioning device being configured to position the patterning device support or the substrate table or both.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A positioning device configured to position an object, the positioning device comprising:
    an object table configured to hold the object;
    an electromagnetic motor configured to displace the object table, the electromagnetic motor comprising:
        a coil assembly;
        a superconductor assembly configured to co-operate with the coil assembly to generate a driving force on the object table; and
        a cryogenic enclosure configured to enclose the superconductor assembly and maintain the superconductor assembly in a superconductive state;
    a support configured to support the cryogenic enclosure; and
    an electromagnetic support configured to suspend the cryogenic enclosure relative to the support so as to maintain a gap between the cryogenic enclosure and the support.

2. The positioning device according to claim 1, wherein the electromagnetic support comprises one or more electromagnetic actuators configured to control a position of the cryogenic enclosure relative to the support.

3. The positioning device according to claim 1, wherein the electromagnetic support is configured to maintain the gap between a bottom surface of the support and a bottom surface of the cryogenic enclosure.

4. The positioning device according to claim 3, wherein the electromagnetic support comprises a passive magnetic support configured to exert, in use, an upward force on the cryogenic enclosure, so as to generate the gap.

5. The positioning device according to claim 1, wherein the electromagnetic support is configured to maintain the gap with a stiffness.

6. The positioning device according to claim 4, wherein the electromagnetic support comprises one or more electromagnetic actuators configured to exert, in use, a downward force on the cryogenic enclosure, the upward force and downward force being configured to support the cryogenic enclosure with a stiffness.

7. The positioning device according to claim 2, wherein the one or more electromagnetic actuators are configured to control a horizontal position of the cryogenic enclosure.

8. The positioning device according to claim 1, further comprising a heat shield arranged inside the gap.

9. The positioning device according to claim 1, wherein the superconductor assembly is configured to generate a spatially alternating magnetic field.

10. The positioning device according to claim 9, wherein the spatially alternating magnetic field is a one-dimensional spatially alternating magnetic field or a two-dimensional spatially alternating magnetic field.

11. The positioning device according to claim 1, wherein the cryogenic enclosure is configured to displace relative to the support, in response to a reaction force of the driving force.

12. The positioning device according to claim 1, wherein the coil assembly is mounted to the object table and wherein the object table further comprises an object holder configured to hold the object and a plurality of actuators for fine positioning the object holder.

13. The positioning device according to claim 12, wherein the plurality of actuators comprises a plurality of electromagnetic actuators or piezoelectric actuators.

14. A magnetic support system comprising:
    a support;
    at least part of a cryogenic enclosure configured to hold a superconductor assembly;
    an electromagnetic support configured to suspend the at least part of the cryogenic enclosure relative to the support so as to maintain a gap between the at least part of the cryogenic enclosure and the support; and
    a heat shield configured to be arranged inside the gap.

15. A lithographic apparatus comprising:
    a patterning device support constructed to support a patterning device, the patterning device being capable of imparting a radiation beam with a pattern in its cross-section to form a patterned radiation beam;
    a substrate table constructed to hold a substrate;
    a projection system configured to project the patterned radiation beam onto a target portion of the substrate; and
    the positioning device according to claim 1, the positioning device configured to position the patterning device support, or the substrate table, or both the patterning device support and the substrate table.

16. The magnetic support system according to claim 14, wherein the electromagnetic support is a contactless support.

17. The magnetic support system according to claim 16, wherein the electromagnetic support comprises a passive magnetic support comprising a first member mounted to the support and a second member configured to be mounted to the at least part of the cryogenic enclosure, the first and second members being configured to exert, in use, an upward force on the at least part of the cryogenic enclosure, so as to generate the gap.

18. The magnetic support system according to claim 14, wherein the electromagnetic support comprises a plurality of electromagnetic actuators, configured to control a position of the at least part of the cryogenic enclosure relative to the support, wherein each of the plurality of electromagnetic actuators comprises a first actuator member configured to be mounted to the support and a second actuator member configured to be mounted to the at least part of the cryogenic enclosure.

19. The magnetic support system according to claim 14, wherein the electromagnetic support comprises one or more electromagnetic actuators configured to control a position of the at least part of the cryogenic enclosure relative to the support.

20. The magnetic support system according to claim 14, wherein the electromagnetic support comprises a passive magnetic support configured to exert, in use, an upward force on the at least part of the cryogenic enclosure, so as to generate the gap.

* * * * *